(12) United States Patent
Taniguchi et al.

(10) Patent No.: US 9,712,139 B2
(45) Date of Patent: Jul. 18, 2017

(54) ELASTIC WAVE FILTER DEVICE

(71) Applicant: Murata Manufacturing Co., Ltd., Nagaokakyo-shi, Kyoto-fu (JP)

(72) Inventors: Yasumasa Taniguchi, Nagaokakyo (JP); Masato Araki, Nagaokakyo (JP); Katsuya Daimon, Nagaokakyo (JP); Masakazu Mimura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/934,351

(22) Filed: Nov. 6, 2015

(65) Prior Publication Data

US 2016/0065176 A1    Mar. 3, 2016

Related U.S. Application Data

(63) Continuation of application No. PCT/JP2014/063993, filed on May 27, 2014.

(30) Foreign Application Priority Data

May 29, 2013    (JP) .................................. 2013-112838

(51) Int. Cl.
| H03H 9/64 | (2006.01) |
| H03H 9/25 | (2006.01) |
| H03H 9/02 | (2006.01) |
| H03H 9/145 | (2006.01) |
| H03H 9/00 | (2006.01) |

(52) U.S. Cl.
CPC ...... H03H 9/6483 (2013.01); H03H 9/02992 (2013.01); H03H 9/145 (2013.01);
(Continued)

(58) Field of Classification Search
CPC ............. H03H 9/0009; H03H 9/02881; H03H 9/02992; H03H 9/145; H03H 9/14541;
(Continued)

(56) References Cited

U.S. PATENT DOCUMENTS

| 4,999,535 A | * | 3/1991 | Mariani | ............. | H03H 9/02818 310/312 |
| 6,292,071 B1 | | 9/2001 | Taniguchi | | |

(Continued)

FOREIGN PATENT DOCUMENTS

| JP | 10-145173 A | * | 5/1998 |
| JP | 2005-159835 A | * | 6/2005 |

(Continued)

OTHER PUBLICATIONS

Offcial Communication issued in International Patent Application No. PCT/JP2014/063993, mailed on Aug. 12, 2014.

Primary Examiner — Barbara Summons
(74) Attorney, Agent, or Firm — Keating & Bennett, LLP

(57) ABSTRACT

An elastic wave filter device includes serial and parallel arms and a plurality of elastic wave resonators. Each elastic wave resonator includes an IDT electrode. In the case where a direction in which electrode fingers extend is taken as a width direction of the IDT electrode, the IDT electrode includes a central area at a center in the width direction, a low acoustic velocity area at an outer side portion of the central area, and a high velocity area at a farther outer side portion thereof. A width of the low acoustic velocity area of at least one elastic wave resonator differs from a width of the low acoustic velocity area of the other elastic wave resonators.

17 Claims, 5 Drawing Sheets

(52) U.S. Cl.
CPC ...... *H03H 9/1457* (2013.01); *H03H 9/14541* (2013.01); *H03H 9/25* (2013.01); *H03H 9/6426* (2013.01); *H03H 9/0009* (2013.01); *H03H 9/6433* (2013.01)

(58) Field of Classification Search
CPC ...... H03H 9/1457; H03H 9/25; H03H 9/6426; H03H 9/6433; H03H 9/6483
USPC .............................. 333/193–196; 310/313 B
See application file for complete search history.

(56) References Cited

U.S. PATENT DOCUMENTS

| | | | |
|---|---|---|---|
| 7,453,334 B1 | | 11/2008 | Abbott et al. |
| 7,576,471 B1 | * | 8/2009 | Solal .................. H03H 9/02858 310/313 B |
| 2008/0315972 A1 | * | 12/2008 | Mayer ................ H03H 9/02881 333/193 |
| 2011/0068655 A1 | | 3/2011 | Solal et al. |
| 2011/0215884 A1 | | 9/2011 | Fujiwara et al. |
| 2013/0051588 A1 | | 2/2013 | Ruile et al. |

FOREIGN PATENT DOCUMENTS

| | | |
|---|---|---|
| JP | 2008-035220 A | 2/2008 |
| JP | 2011-101350 A | 5/2011 |
| JP | 2011-205625 A | 10/2011 |
| JP | 2013-518455 A | 5/2013 |
| KR | 2000-0047665 A | 7/2000 |
| KR | 10-2012-0120355 A | 11/2012 |
| WO | 2011/088904 A1 | 7/2011 |

\* cited by examiner

ELASTIC WAVE FILTER DEVICE

BACKGROUND OF THE INVENTION

1. Field of the Invention

The present invention relates to elastic wave filter devices including a plurality of elastic wave resonators connected together, and particularly relates to elastic wave filter devices including serial and parallel arms.

2. Description of the Related Art

A variety of filter devices including serial and parallel arm resonators configured of surface acoustic wave resonators have been proposed. For example, WO 2011/088904 A1 and Japanese Unexamined Patent Application Publication No. 2011-101350 disclose a structure in which an acoustic velocity in an electrode finger leading end-side portion is lower than an acoustic velocity in an electrode finger intersecting portion in an IDT (interdigital transducer) electrode. It is discussed that a piston mode is formed by using the above structure so that ripples due to transverse modes can be suppressed.

Further, WO 2011/088904 A1 discloses that the width of an opening, areas in which acoustic velocities differ from each other, and so on in a serial arm resonator are set to be different from the width of an opening, areas in which acoustic velocities differ from each other, and so on in a parallel arm resonator.

Japanese Unexamined Patent Application Publication No. 2011-205625 discloses a ladder filter in which an intersecting width of a parallel arm resonator is larger than an intersecting width of a serial arm resonator. With this structure, it is expected to suppress spurious caused by transverse modes and realize the miniaturization. Making the intersecting width of the parallel arm resonator larger increases transverse mode harmonics. It is described that the increase in the transverse mode harmonics disperses the transverse mode spurious.

WO 2011/088904 A1 and Japanese Unexamined Patent Application Publication No. 2011-101350 disclose a configuration in which transverse mode ripples are suppressed by forming a piston mode. In particular, it is disclosed in WO 2011/088904 A1 that the width of the opening, shapes of the areas in which acoustic velocities differ from each other, and so on are set to be different between the serial arm resonator and the parallel arm resonator. However, the suppression of transverse mode ripples cannot be realized with certainty only by simply setting the width of the opening, the areas in which acoustic velocities differ from each other, and so on, to be different between the serial arm resonator and the parallel arm resonator.

Furthermore, it is difficult to sufficiently suppress transverse mode ripples only by simply changing the intersecting width as disclosed in Japanese Unexamined Patent Application Publication No. 2011-205625.

SUMMARY OF THE INVENTION

Preferred embodiments of the present invention provide an elastic wave filter device that significantly reduces or prevents transverse mode ripples with certainty.

An elastic wave filter device according to a preferred embodiment of the present invention includes a serial arm connecting an input terminal to an output terminal and a parallel arm connecting the serial arm to a ground potential, and also includes a plurality of elastic wave resonators. In a preferred embodiment of the present invention, each of the elastic wave resonators includes a piezoelectric substrate and an IDT electrode located on the piezoelectric substrate.

In a preferred embodiment of the present invention, the IDT electrode includes a first busbar, a second busbar spaced from the first busbar, a plurality of first electrode fingers, each base end of which is electrically connected to the first busbar, that extend toward the second busbar side, and a plurality of second electrode fingers, each base end of which is electrically connected to the second bus bar, that extend toward the first busbar side and are interleaved with the plurality of first electrode fingers.

Further, there are provided a central area at a center in a direction in which the first and second electrode fingers of the IDT electrode extend, a low acoustic velocity area at an outer side portion of the central area in a direction in which the electrode fingers extend where an acoustic velocity is relatively low in comparison with the central area, and a high acoustic velocity area at an outer side portion in a direction in which the low acoustic velocity area extends where an elastic wave propagation velocity is higher than an elastic wave propagation velocity in the central area. In a preferred embodiment of the present invention, in the case where a direction perpendicular or substantially perpendicular to an elastic wave propagation direction is taken as a width direction, a dimension of the low acoustic velocity area in the width direction of at least one elastic wave resonator differs from a dimension of the low acoustic velocity area in the width direction of the other elastic wave resonators.

In a specific aspect of an elastic wave filter device according to a preferred embodiment of the present invention, the first and second busbars respectively include a plurality of cavities arranged in a dispersed manner along the elastic wave propagation direction. An inner side portion relative to the cavities in the width direction of the IDT electrode is taken as an inner side busbar section, a portion where the plurality of cavities are provided is taken as a central busbar section, and an outer side portion relative to the central busbar section is taken as an outer side busbar section. The inner side busbar section preferably is belt-shaped extending in the elastic wave propagation direction, and the central busbar section defines the high acoustic velocity area.

In further another specific aspect of an elastic wave filter device according to a preferred embodiment of the present invention, the inner side busbar width and/or a wide width portion provided on the base end side relative to the central area are included, and the inner side busbar width and/or a width of the wide width portion differ between at least the one elastic wave resonator and the other elastic wave resonators.

In another specific aspect of an elastic wave filter device according to a preferred embodiment of the present invention, a ladder filter includes a serial arm resonator including a plurality of elastic wave resonators provided in the serial arm and a parallel arm resonator including a plurality of elastic wave resonators provided in the parallel arm, in which at least the one elastic wave resonator corresponds to the serial arm resonator and the other elastic wave resonators correspond to the parallel arm resonator.

In still another specific aspect of an elastic wave filter device according to a preferred embodiment of the present invention, a dimension of a low acoustic velocity area in the width direction of the serial arm resonator is smaller than a dimension of a low acoustic velocity area in the width direction of the parallel arm resonator.

In still another specific aspect of an elastic wave filter device according to a preferred embodiment of the present invention, the serial arm resonator includes a plurality of resonators and the parallel arm resonator also includes a plurality of resonators, and a dimension of each low acoustic velocity area in the width direction of the plurality of serial arm resonators is smaller than a dimension of each low acoustic velocity area in the width direction of the plurality of parallel arm resonators.

In still another specific aspect of an elastic wave filter device according to a preferred embodiment of the present invention, a dimension of the low acoustic velocity area in the width direction of at least one of the plurality of serial arm resonators differs from a dimension of the low acoustic velocity area in the width direction of the other serial arm resonators.

In still another specific aspect of an elastic wave filter device according to a preferred embodiment of the present invention, a dimension of the low acoustic velocity area in the width direction of at least one of the plurality of parallel arm resonators differs from a dimension of the low acoustic velocity area in the width direction of the other parallel arm resonators.

In still another specific aspect of an elastic wave filter device according to a preferred embodiment of the present invention, the low acoustic velocity area includes the inner side busbar width and/or the wide width portion provided on the base end side relative to the central area, and the inner side busbar width and/or the width of the wide width portion are smaller in the serial arm resonator than in the parallel arm resonator.

In an elastic wave filter device according to various preferred embodiments of the present invention, because the width of a low acoustic velocity area in at least one elastic wave resonator differs from the width of each low acoustic velocity area in the other elastic wave resonators, transverse mode ripples are effectively reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through description of specific preferred embodiments of the invention with reference to the drawings.

Figure 2:
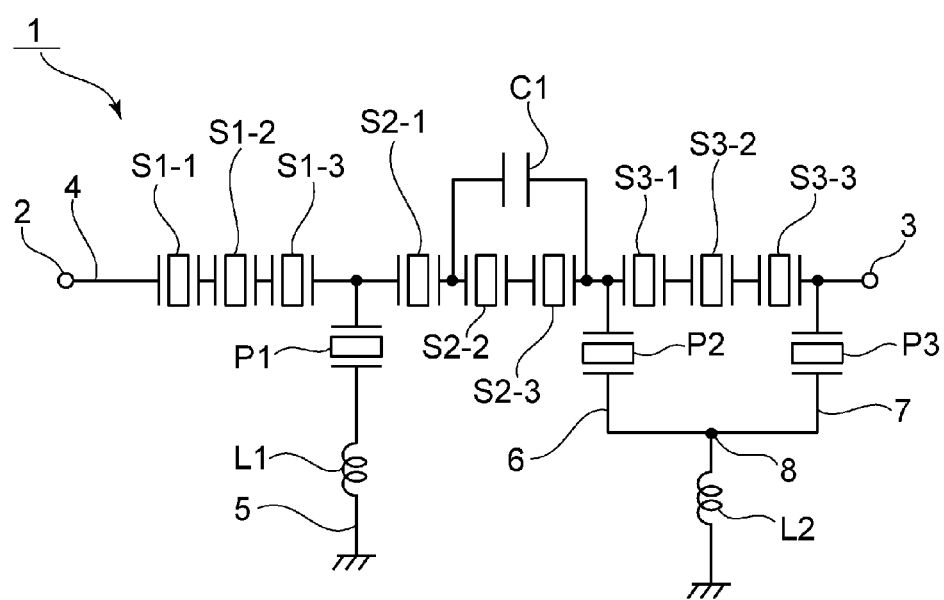
FIG. 2 is a circuit diagram of the elastic wave filter device according to the first preferred embodiment of the present invention.

FIG. 2 is a circuit diagram of an elastic wave filter device according to a first preferred embodiment of the present invention. An elastic wave filter device 1 preferably is a ladder filter. Note that, however, the present invention is not limited to a ladder filter, as described later.

The elastic wave filter device 1 includes a serial arm 4 connecting an input terminal 2 to an output terminal 3. There are provided first through third parallel arms 5, 6, and 7 that connect the serial arm 4 to a ground potential. A plurality of serial arm resonators S1-1, S1-2, S1-3, S2-1, S2-2, S2-3, S3-1, S3-2, and S3-3 are arranged in the serial arm 4. A capacitor C1 is connected in parallel to the serial arm resonators S2-2 and S2-3.

The parallel arm 5 connects a connection point between the serial arm resonators S1-3 and S2-1 to the ground potential. In the parallel arm 5, a parallel arm resonator P1 and an inductance L1 are connected in series.

The second parallel arm 6 is connected to a connection point between the serial arm resonators S2-3 and S3-1. The third parallel arm 7 is connected to the output terminal 3.

A parallel arm resonator P2 is disposed in the second parallel arm 6, and a parallel arm resonator P3 is disposed in the third parallel arm 7. The second parallel arm 6 and the third parallel arm 7 are connected to each other with a shared connection point 8, and an inductance L2 is connected between the shared connection point 8 and the ground potential.

In the elastic wave filter device 1, the serial arm resonators S1-1 through S3-3 and the parallel arm resonators P1 through P3 preferably are defined by surface acoustic wave resonators, for example.

The surface acoustic wave resonator has a structure in which an IDT electrode is provided on a piezoelectric substrate, as widely known.

Figure 3A:
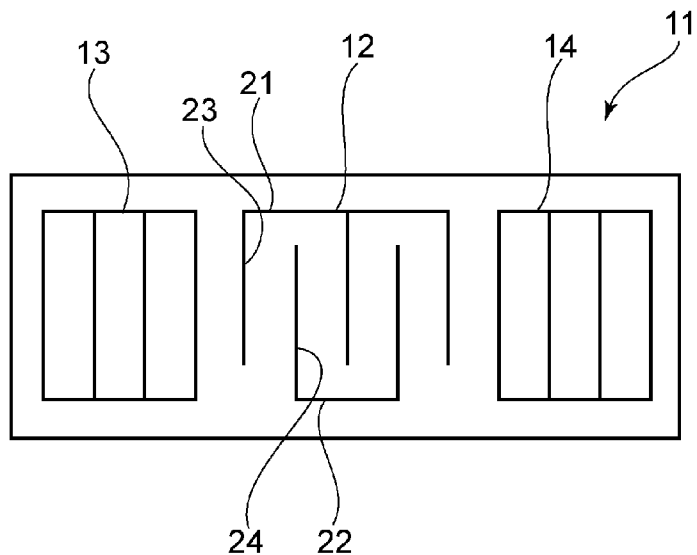
FIG. 3A and FIG. 3B are a schematic plan view of a serial arm resonator S1-1 and an enlarged cross-sectional view illustrating an electrode structure of the resonator, respectively, in the elastic wave filter device according to the first preferred embodiment of the present invention.
Figure 3B:
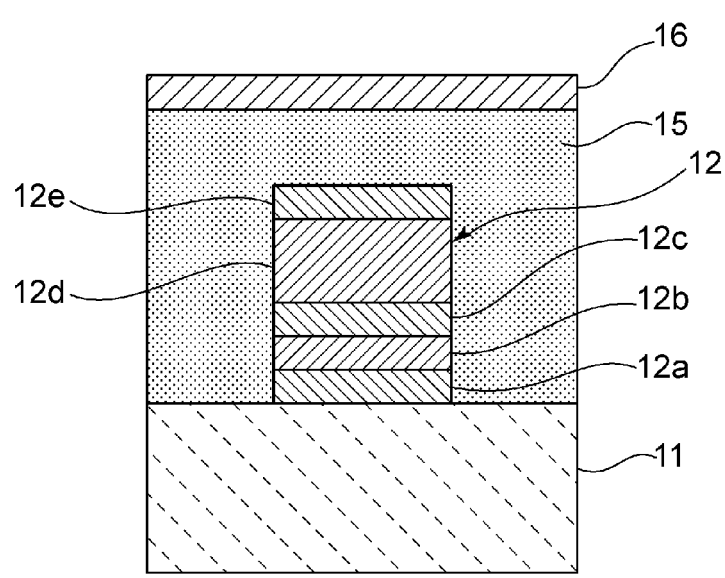

FIG. 3A and FIG. 3B are a schematic plan view of the serial arm resonator S1-1 and an enlarged cross-sectional view illustrating an electrode structure of the resonator, respectively.

As shown in FIG. 3A, the serial arm resonator S1-1 includes a piezoelectric substrate 11 and an IDT electrode 12 provided on the piezoelectric substrate 11. Reflectors 13 and 14 are provided on both sides of the IDT electrode 12 in a propagation direction of the surface acoustic wave. The serial arm resonator S1-1 preferably is a one-port type surface acoustic wave resonator having the above-described structure. Although not illustrated in FIG. 3A, a film of $SiO_2$ and a film of SiN preferably are laminated as dielectric layers so as to cover the IDT electrode 12 and the reflectors 13 and 14.

FIG. 3B illustrates the above lamination structure in an enlarged manner. In the present preferred embodiment, the piezoelectric substrate 11 preferably is made of LiNbO$_3$ with an Euler angle of about 127.5° Y-X, for example. In the present invention, however, the material for forming the piezoelectric substrate is not limited to any specific one. In other words, various types of piezoelectric single crystals or piezoelectric ceramics can be used.

FIG. 3B illustrates, in an enlarged manner, a portion where a single electrode finger of the IDT electrode 12 is located. The IDT electrode 12 is provided on the piezoelectric substrate 11. The IDT electrode 12 preferably is defined by laminated metal films in the present preferred embodiment. In other words, the electrode preferably has a structure in which a NiCr film 12a, a Pt film 12b, a Ti film 12c, an AlCu film 12d, and a Ti film 12e are laminated in that order from bottom. In the present preferred embodiment, the thicknesses of the respective layers preferably are as follows: that is, NiCr film 12a: 100 Å; Pt film 12b: 360 Å; Ti film 12c: 100 Å; AlCu film 12d: 1500 Å; Ti film 12e: 100 Å, for example. Note that a SiO$_2$ film 15 is laminated so as to cover the IDT electrode 12. A thickness as a dimension of the SiO$_2$ film 15 extending from an upper surface of the piezoelectric substrate 11 up to an upper surface of the SiO$_2$ film 15 preferably is 5700 Å, for example. A SiN film 16 is laminated on the SiO$_2$ film 15. The SiN film 16 preferably is 200 Å in thickness, for example.

It is not absolutely necessary to provide the SiO$_2$ film 15 and the SiN film 16 as the dielectric layers.

The structure of the surface acoustic wave resonator has been described, while taking the serial arm resonator S1-1 as a representative. Note that the other serial arm resonators S1-2 through S3-3 and the parallel arm resonators P1 through P3 also preferably include the same one-port type surface acoustic wave resonator. Further, the electrode structure, the dielectric layer thickness, and so on of each of the surface acoustic wave resonators are preferably set to be the same as those of the serial arm resonator S1-1.

In the elastic wave filter device 1 of the present preferred embodiment, a low acoustic velocity area and a high acoustic velocity area are provided in each surface acoustic wave resonator of the serial arm resonators S1-1 through S3-3 and the parallel arm resonators P1 through P3. In order to significantly reduce or prevent transverse mode ripples by using a piston mode, the following low and high acoustic velocity areas are provided. This will be more specifically described below with reference to FIGS. 1A and 1B.

Figure 1A:
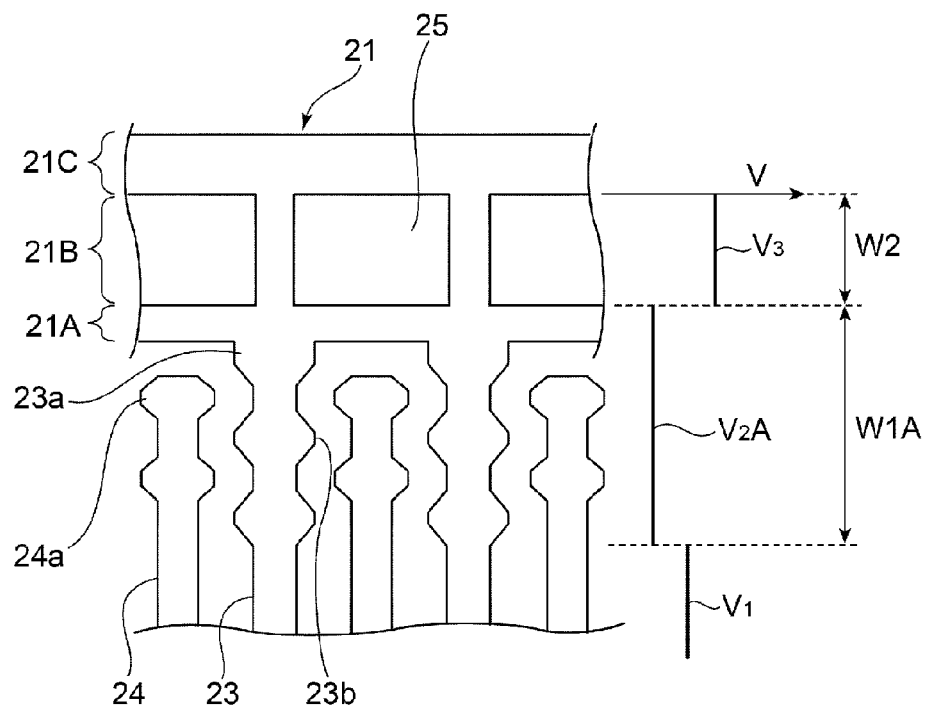
FIG. 1A and FIG. 1B are an enlarged partial cutout plan view illustrating the principal portion of an IDT electrode of a single serial arm resonator and an enlarged partial cutout plan view illustrating the principal portion of an IDT electrode of a single parallel arm resonator, respectively, in an elastic wave filter device according to a first preferred embodiment of the present invention.

FIG. 1A is an enlarged partial cutout plan view illustrating the principal portion of the IDT electrode of the serial arm resonator S3-1. In the serial arm resonator S3-1, the IDT electrode includes a first busbar 21. In FIG. 1A, only the first busbar 21 side is illustrated whereas a second busbar side is omitted. However, it is to be noted that the second busbar side is preferably configured in the same manner as the first busbar side.

In the IDT electrode, a direction perpendicular or substantially perpendicular to the surface acoustic wave propagation direction, or a direction in which the electrode fingers extend is referred to as a width direction. The busbar 21 includes an inner side busbar section 21A, a central busbar section 21B, and an outer side busbar section 21C. Here, the term "inner side" refers to a side of an area where first and second electrode fingers 23 and 24 intersect with each other.

A base end of the first electro finger 23 is connected to the first busbar 21. A base end of the second electrode finger 24 is connected to the second busbar (not shown).

In the first busbar 21, a cavity 25 is provided in the central busbar section 21B. The cavity 25 preferably has a rectangular or substantially rectangular shape in the present preferred embodiment. Note that, however, the shape of the cavity 25 is not limited to any specific one. Providing the cavity 25 allows an acoustic velocity in the central busbar section 21B, where the cavity 25 is provided, to be higher as represented by "V$_3$". The area where the central busbar section 21B is provided defines a high acoustic velocity area.

The inner side busbar section 21A is a busbar portion that preferably is elongated belt-shaped. As such, since this busbar section is a metallized area, a low acoustic velocity area is provided therein. Further, the base end side portion of the first finger electrode 23 includes a convex portion 23a and a plurality of wide width portions 23b having width-direction projections. A wide width portion 24a is also provided at a leading end side of the second electrode finger 24. As such, since the wide width portions 23b and 24a are provided, this area defines a low acoustic velocity area.

Meanwhile, a central portion of an area where the first electrode finger 23 and the second electrode finger 24 intersect with each other in the width direction is a central area represented by an acoustic velocity V'.

In other words, in the serial arm resonator S3-1, the low acoustic velocity area is positioned at the outer side portion of the central area, and the high acoustic velocity area is positioned at the outer side portion of the low acoustic velocity area. The acoustic velocity in the central area is V$_1$, the acoustic velocity in the low acoustic velocity area is V$_2$A, and the acoustic velocity in the high acoustic velocity area is V$_3$. Further, a width of the low acoustic velocity area is W1A, and a width of the high acoustic velocity area is W2.

In the present preferred embodiment, the width of the low acoustic velocity area of the serial arm resonator S3-1 is W1A, and a width of each low acoustic velocity area of the serial arm resonators S3-2 and S3-3 is also W1A, which is the same in dimension as that of the serial arm resonator S3-1.

Figure 1B:
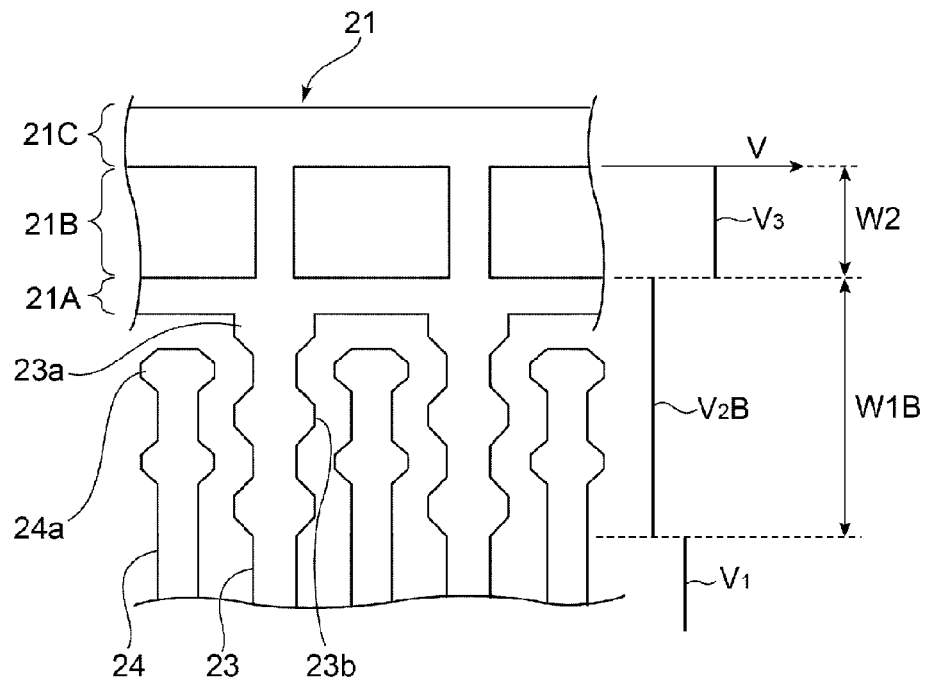

On the other hand, FIG. 1B is a view illustrating the principal portion of the IDT electrode of the parallel resonator P1 in the present preferred embodiment. The electrode structure of the parallel arm resonator P1 is substantially the same as that of the serial arm resonator S3-1 shown in FIG. 1A. Note that, however, a width W1B of the low acoustic velocity area is larger than the width W1A of the low acoustic velocity area shown in FIG. 1A. In other words, in the present preferred embodiment, the width W1A of the low acoustic velocity area of the serial arm resonators S3-1 through S3-3 is smaller than the width W1B of the low acoustic velocity area of the parallel arm resonator P1.

Moreover, the width W1B of the above low acoustic velocity area is larger than the width of the low acoustic velocity area of the other parallel arm resonators P2 and P3, and also larger than the width of the low acoustic velocity area of the serial arm resonators S1-1 through S3-3.

In the present preferred embodiment, because the width W1A of the low acoustic velocity area of the serial arm resonators S3-1 through S3-3 is made smaller than the width of the low acoustic velocity area of the other resonators, transverse mode ripples are effectively reduced or prevented in the pass band. This will be explained hereinafter based on a specific experiment example.

In Table 1 shown below, indicated are design parameters of the serial arm resonators S1-1 through S3-3 and the parallel arm resonators P1 through P3 of the present preferred embodiment.

TABLE 1

|  | P1 | S1-1 | S1-2 | S1-3 | P2 | S2-1 | S2-2 | S2-3 | P3 | S3-1 | S3-2 | S3-3 |
|---|---|---|---|---|---|---|---|---|---|---|---|---|
| IDT Wavelength (μm) | 2.150 | 2.040 | 2.040 | 2.040 | 2.137 | 2.043 | 2.042 | 2.034 | 2.113 | 2.033 | 2.033 | 2.033 |
| Intersecting Width (μm) | 48 | 38 | 38 | 38 | 53 | 42 | 41 | 31 | 61 | 34 | 34 | 29 |
| Number of Pairs | 87 | 171 | 171 | 171 | 97 | 189 | 188 | 139 | 110 | 152 | 152 | 133 |
| Duty | 0.475 | 0.475 | 0.475 | 0.475 | 0.475 | 0.475 | 0.475 | 0.475 | 0.475 | 0.475 | 0.475 | 0.475 |

Figure 4:
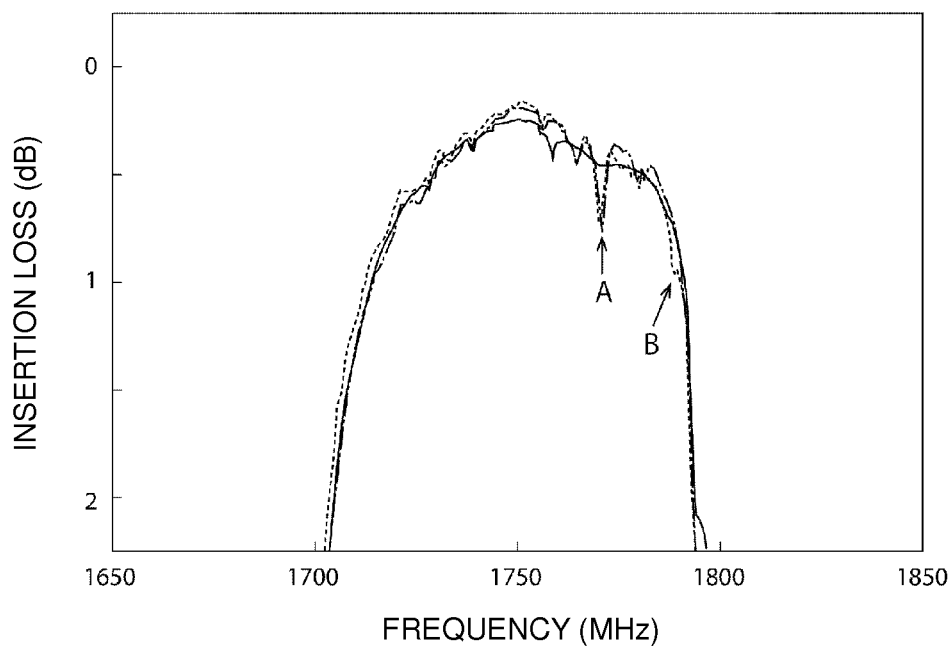
FIG. 4 is a diagram illustrating respective filter characteristics of the elastic wave filter device according to the first preferred embodiment, an elastic wave filter device according to a second preferred embodiment of the present invention, and an elastic wave filter device according to a comparative example.

In FIG. 4, a solid line represents attenuation frequency characteristics of the elastic wave filter device 1 of the present preferred embodiment. A broken line represents a result of a comparative example in which widths of the low acoustic velocity areas are the same in all the resonators and widths of the high acoustic velocity areas are also the same in all the resonators. A dot-dash line represents attenuation frequency characteristics of a second preferred embodiment, which will be explained later.

As is clear when the solid line and the broken line are compared, it is understood that a large ripple indicated by an arrow A appears in the comparative example, but does not appear in the present preferred embodiment. Further, it is also understood that a ripple indicated by an arrow B appears in the filter characteristics represented by the broken line, but does not appear in the present preferred embodiment.

It can be considered that the transverse mode ripple indicated by the arrow A is a ripple caused by the serial arm resonators S3-1 through S3-3.

In the ladder filter, the pass band is defined by an anti-resonant frequency of a parallel arm resonator and a resonant frequency of a serial arm resonator. Accordingly, in the case where a transverse mode remains in the vicinity of the anti-resonant frequency of the parallel arm resonator and the vicinity of the resonant frequency of the serial arm resonator, a ripple is generated within the pass band.

In the comparative example represented by the broken line in FIG. 4, the low acoustic velocity areas of all the resonators are the same in dimension and the high acoustic velocity areas of all the resonators are also the same in dimension. As such, transverse mode ripples cannot be completely reduced or prevented in all the resonators. This allows transverse mode ripples to be generated within the pass band. Accordingly, there arises a problem that the loss is worsened within the pass band. In particular, as indicated by the arrow A in FIG. 4, the transverse mode ripple is generated within the pass band caused by the serial arm resonators S3-1, S3-2, and S3-3. Here, it can be assumed by comparing with the second preferred embodiment to be discussed later that the ripple indicated by the arrow A is generated by the serial arm resonators S3-1 through S3-3.

In the present preferred embodiment, as represented by the solid line in FIG. 4, the transverse mode ripple indicated by the arrow A does not appear. This is because, as mentioned earlier, the width W1A of the low acoustic velocity area in the serial arm resonators S3-1 through S3-3 is smaller than the width of the low acoustic velocity area in the other serial arm resonators S1-1 through S2-3. In other words, because transverse mode ripples in S3-1 through S3-3 are reduced or prevented by making the width of the low acoustic velocity area smaller, it is understood that the ripple indicated by the arrow A within the pass band is significantly reduced or prevented.

In the present preferred embodiment, the width W1B of the low acoustic velocity area in the parallel arm resonator P1 is made larger than the width of the low acoustic velocity area in the other parallel arm resonators P2 and P3, and also larger than the width of the low acoustic velocity area in the serial arm resonators S1-1 through S1-3. Accordingly, the transverse mode ripple indicated by the arrow B is also significantly reduced or prevented.

In FIG. 4, the dot-dash line represents the attenuation frequency characteristics of an elastic wave filter device as the second preferred embodiment configured in the same manner as the elastic wave filter device of the above preferred embodiment except that the width of the low acoustic velocity area of the serial arm resonators S3-1 through S3-3 is the same as that of the serial arm resonators S1-1 through S2-3. In other words, in the second preferred embodiment, the width of the low acoustic velocity area of the serial arm resonators S1-1 through S3-3 is preferably smaller than the width of the low acoustic velocity area of the parallel arm resonators P1 through P3. As is clear when the filter characteristics represented by the dot-dash line and the filter characteristics of the comparative example represented by the broken line being compared, it is understood that the transverse mode ripples caused by the parallel arm resonator P1 are also significantly reduced or prevented in the second preferred embodiment as well.

However, it is preferable that, like the first preferred embodiment, the width W1A of the low acoustic velocity area in the serial arm resonators S3-1 through S3-3 be smaller than the width of the low acoustic velocity area in the other serial arm resonators S1-1 through S2-3. With this, it is understood that the ripple indicated by the arrow A is also significantly reduced or prevented.

As is clear from the first and second preferred embodiments, in the elastic wave filter device 1 having a ladder circuit configuration, it is preferable that the width of the low acoustic velocity area in the serial arm resonators S1-1 through S3-3 be smaller than the width of the low acoustic velocity area in the parallel arm resonators P1 through P3. This makes it possible to significantly reduce or prevent transverse mode ripples that are generated in the vicinity of the resonant frequency of the serial arm resonator and the vicinity of the anti-resonant frequency of the parallel arm resonator. As a result, ripples within the band are significantly reduced or prevented. Accordingly, the ripples within the band are effectively significantly reduced or prevented in the elastic wave filter device having the ladder circuit configuration.

With the configurations disclosed in WO 2011/088904 A1, Japanese Unexamined Patent Application Publication No. 2011-101350 and Japanese Unexamined Patent Application Publication No. 2011-205625, it is difficult to sufficiently suppress transverse mode ripples within the band. In particular, it is disclosed in WO 2011/088904 A1 that the width of an opening, the shapes of areas in which acoustic velocities differ from each other, and so on in an IDT electrode are set to be different between the serial arm resonator and the parallel arm resonator. However, it is difficult to sufficiently suppress transverse mode ripples only with the configuration disclosed in WO 2011/088904 A1. In contrast, with the configurations of various preferred embodiments of the present invention, it has been discovered and confirmed that transverse mode ripples are significantly reduced or prevented by particularly making the width of the low acoustic velocity area in the serial arm resonator differ from the width of the low acoustic velocity area in the parallel arm resonator. As such, the transverse mode ripples within the band are effectively significantly reduced or prevented.

It is to be noted that the present invention is not limited to the elastic wave filter device having the ladder circuit configuration as described in the above preferred embodiments. In other words, various preferred embodiments of the present invention can be applied to such various types of filter devices that include serial and parallel arms and a plurality of elastic wave resonators. For example, various preferred embodiments of the present invention may be applied to a filter device including serial and parallel arms, where elastic wave resonators are disposed in the plurality of parallel arms but not disposed in the serial arm. Alternatively, various preferred embodiments of the present invention may be applied to a filter device in which, conversely, a plurality of elastic wave resonators are connected to the serial arm in series to each other while the parallel arms do not have any elastic wave resonator. Further, various preferred embodiments of the present invention may be applied to an elastic wave filter device in which the serial arm includes one elastic wave resonator and the parallel arm includes another elastic wave resonator.

In any case, by allowing the width of the low acoustic velocity area in at least one elastic wave resonator among the plurality of elastic wave resonators to differ from the width of the low acoustic velocity area in the other elastic wave resonators, ripples within the band are significantly reduced or prevented in accordance with various preferred embodiments of the present invention. In particular, it is more effective to shorten the width of the low acoustic velocity area in the elastic wave resonator disposed in the serial arm than to shorten the width of the low acoustic velocity area in the elastic wave resonator disposed in the parallel arm. By doing so, ripples within the pass band are effectively significantly reduced or prevented.

Note that the elastic wave resonator included in various preferred embodiments of the present invention may be a surface acoustic wave resonator making use of the aforementioned surface acoustic waves, or may be an elastic wave resonator making use of other elastic waves such as boundary acoustic waves or the like.

That is to say, an arbitrary elastic wave resonator including an IDT electrode can be used.

The width of the low acoustic velocity area can be changed in various modes. For example, in the case where the serial arm resonator S3-1 shown in FIG. 1A is taken as an example, the change of the above-mentioned width can be made by changing the dimension in the width direction of the area where the wide width portion 23b is provided, the width of the belt-shaped busbar portion defining the inner side busbar section 21A, or the like.

Figure 5:
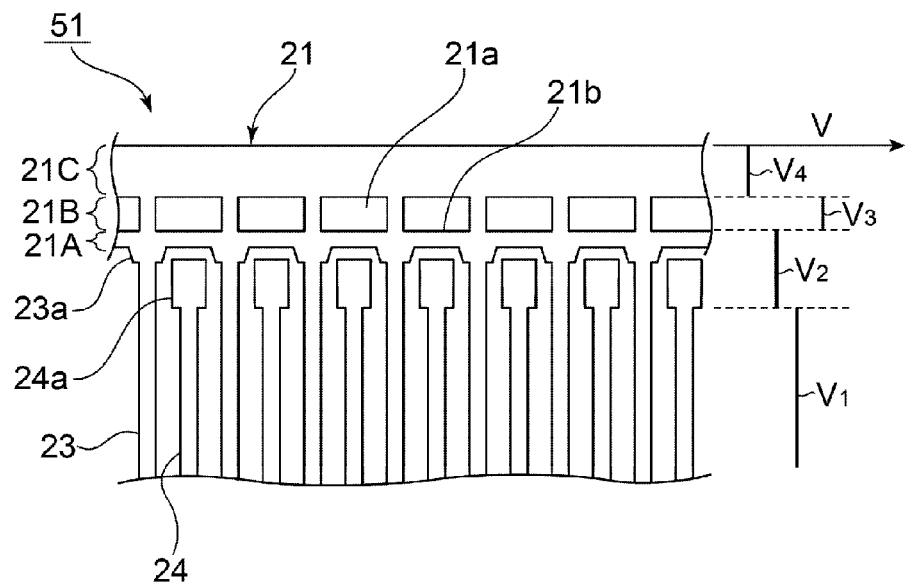
FIG. 5 is a partial cutout plan view illustrating a variation on a planar shape of an elastic wave resonator IDT electrode used in an elastic wave resonator that is used in an elastic wave filter device according to a preferred embodiment of the present invention.

The present invention is not limited to the configuration shown in FIG. 1A where the plurality of wide width portions are provided at the leading end side and the base end side of the electrode fingers; a configuration in which a single wide width portion 24a is provided at the leading end side of the second electrode finger 24, like an elastic wave resonator 51 shown in FIG. 5, may be provided.

Figure 6:
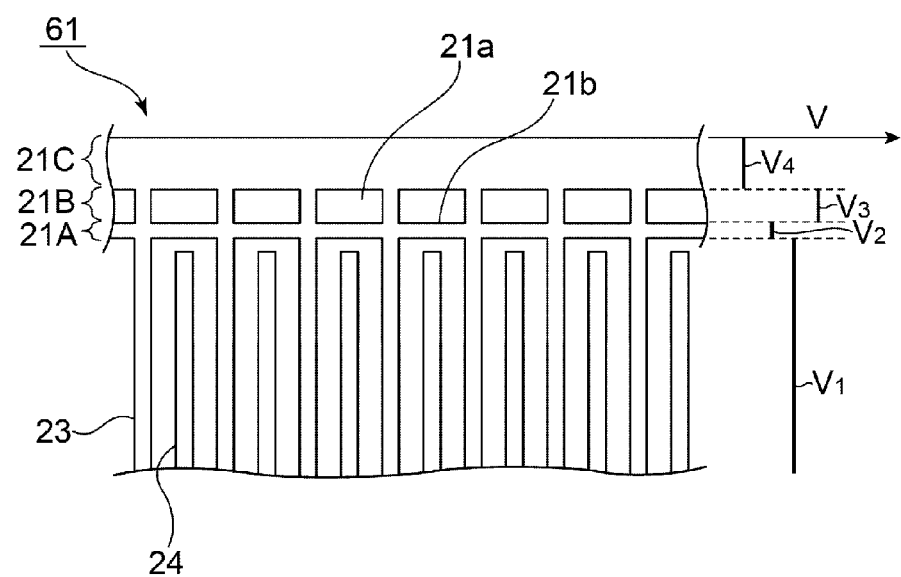
FIG. 6 is a partial cutout plan view illustrating another variation on a planar shape of an elastic wave resonator IDT electrode used in an elastic wave resonator that is used in an elastic wave filter device according to a preferred embodiment of the present invention.

Further, like an elastic wave resonator 61 shown in FIG. 6, the wide width portion may not be provided on the first and second finger electrodes 23 and 24, and the low acoustic velocity area may be provided only with the inner side busbar section 21A. In this case, adjusting the width of the inner side busbar section 21A makes it possible to adjust the width of the low acoustic velocity area.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
   a serial arm connecting an input terminal to an output terminal;
   a parallel arm connecting the serial arm to a ground potential; and
   a plurality of elastic wave resonators; wherein
   at least two of the plurality of elastic wave resonators includes a piezoelectric substrate and an interdigital transducer electrode located on the piezoelectric substrate;
   the interdigital transducer electrode includes:
      a first busbar;
      a second busbar spaced from the first busbar;
      a plurality of first electrode fingers, each base end of which is electrically connected to the first busbar, that extend toward the second busbar side;
      a plurality of second electrode fingers, each base end of which is electrically connected to the second bus bar, that extend toward the first busbar side and are interleaved with the plurality of first electrode fingers;
      a central area at a center in a direction in which the first and second electrode fingers of the interdigital transducer electrode extend;
      a low acoustic velocity area at an outer side portion of the central area in a direction in which the electrode fingers extend where an acoustic velocity is relatively low in comparison with the central area; and
      a high acoustic velocity area at an outer side portion in a direction in which the low acoustic velocity area extends where an elastic wave propagation velocity is higher than an elastic wave propagation velocity in the central area;
   when a direction perpendicular or substantially perpendicular to an elastic wave propagation direction is taken as a width direction, a dimension of the low acoustic velocity area in the width direction of one of the at least two of the plurality of elastic wave resonators differs from a dimension of the low acoustic velocity area in the width direction of another one of the at least two of the plurality of elastic wave resonators;
   the first and second busbars respectively include a plurality of cavities arranged in a dispersed manner along the elastic wave propagation direction, an inner side portion relative to the cavities in the width direction of the interdigital transducer electrode is taken as an inner side busbar section, a portion where the plurality of cavities are provided is taken as a central busbar section, and an outer side portion relative to the central busbar section is taken as an outer side busbar section;

the inner side busbar section is belt-shaped and extends in the elastic wave propagation direction; and the central busbar section defines the high acoustic velocity area.

2. The elastic wave filter device according to claim 1, wherein at least one of the first electrode fingers and/or the second electrode fingers includes a wide width portion provided on the base end side relative to the inner side busbar section and/or the central area, and a width of the inner side busbar section and/or a width of the wide width portion differ between the at least one of the plurality of elastic wave resonators and the another one of the plurality of elastic wave resonators.

3. The elastic wave filter device according to claim 1, wherein the serial arm includes at least one serial arm resonator included in the plurality of elastic wave resonators;

the parallel arm includes at least one parallel arm resonator included in the plurality of elastic wave resonators;

the one of the at least two of the plurality of elastic wave resonators is included in the at least one serial arm resonators; and the another one of the at least two of the plurality of elastic wave resonators is included in the at least one parallel arm resonator.

4. The elastic wave filter device according to claim 3, wherein a dimension of the low acoustic velocity area in the width direction of the at least one serial arm resonator is smaller than a dimension of the low acoustic velocity area in the width direction of the at least one parallel arm resonator.

5. The elastic wave filter device according to claim 3, wherein the at least one serial arm resonator includes a plurality of serial arm resonators and the at least one parallel arm resonator includes a plurality of parallel arm resonators, and a dimension of each low acoustic velocity area in the width direction of the plurality of serial arm resonators is smaller than a dimension of each low acoustic velocity area in the width direction of the plurality of parallel arm resonators.

6. The elastic wave filter device according to claim 5, wherein the plurality of serial arm resonators and the plurality of parallel arm resonators are defined by one of surface acoustic wave resonators and boundary acoustic wave resonators.

7. The elastic wave filter device according to claim 5, wherein the plurality of serial arm resonators and the plurality of parallel arm resonators are defined by surface acoustic wave resonators.

8. The elastic wave filter device according to claim 5, wherein a pass band is defined by a resonant frequency of at least one of the plurality of serial arm resonators and an anti-resonant frequency of at least one of the plurality of parallel arm resonators.

9. The elastic wave filter device according to claim 5, wherein the dimension of each low acoustic velocity area in the width direction of the plurality of serial arm resonators is the same.

10. The elastic wave filter device according to claim 3, wherein the low acoustic velocity area includes a wide width portion, and a width of the inner side busbar section and/or a width of the wide width portion are smaller in the at least one serial arm resonator than in the at least one parallel arm resonator.

11. The elastic wave filter device according to claim 1, wherein the parallel arm is a first parallel arm, the elastic wave filter device further comprising second and third parallel arms, and the first, second, and third parallel arms connect the serial arm to the ground potential.

12. The elastic wave filter device according to claim 1, wherein the parallel arm includes a parallel arm resonator and an inductor connected in series; and the plurality of elastic wave resonators include the parallel arm resonator.

13. An elastic wave filter device comprising:

a serial arm connecting an input terminal to an output terminal;

a parallel arm connecting the serial arm to a ground potential; and a plurality of elastic wave resonators; wherein at least two of the plurality of elastic wave resonators includes a piezoelectric substrate and an interdigital transducer electrode located on the piezoelectric substrate;

the interdigital transducer electrode includes:

a first busbar;

a second busbar spaced from the first busbar;

a plurality of first electrode fingers, each base end of which is electrically connected to the first busbar, that extend toward the second busbar side;

a plurality of second electrode fingers, each base end of which is electrically connected to the second bus bar, that extend toward the first busbar side and are interleaved with the plurality of first electrode fingers;

a central area at a center in a direction in which the first and second electrode fingers of the interdigital transducer electrode extend;

a low acoustic velocity area at an outer side portion of the central area in a direction in which the electrode fingers extend where an acoustic velocity is relatively low in comparison with the central area; and a high acoustic velocity area at an outer side portion in a direction in which the low acoustic velocity area extends where an elastic wave propagation velocity is higher than an elastic wave propagation velocity in the central area;

when a direction perpendicular or substantially perpendicular to an elastic wave propagation direction is taken as a width direction, a dimension of the low acoustic velocity area in the width direction of one of the at least two of the plurality of elastic wave resonators differs from a dimension of the low acoustic velocity area in the width direction of another one of the at least two plurality of elastic wave resonators;

the serial arm includes at least two serial arm resonators included in the plurality of elastic wave resonators; and the at least two serial arm resonators include the one of the at least two of the plurality of elastic wave resonators and the another one of the at least two of the plurality of elastic wave resonators.

14. The elastic wave filter device according to claim 13, wherein the parallel arm includes at least one parallel arm resonator included in the plurality of elastic wave resonators; and a dimension of the low acoustic velocity area in the width direction of the one of the at least two of the plurality of elastic wave resonators included in the at least two serial arm resonators is smaller than a dimension of the low acoustic velocity area in the width direction of the at least one parallel arm resonator.

15. An elastic wave filter device comprising:
a serial arm connecting an input terminal to an output terminal;
a parallel arm connecting the serial arm to a ground potential; and
a plurality of elastic wave resonators; wherein
at least two of the plurality of elastic wave resonators includes a piezoelectric substrate and an interdigital transducer electrode located on the piezoelectric substrate;
the interdigital transducer electrode includes:
  a first busbar;
  a second busbar spaced from the first busbar;
  a plurality of first electrode fingers, each base end of which is electrically connected to the first busbar, that extend toward the second busbar side;
  a plurality of second electrode fingers, each base end of which is electrically connected to the second bus bar, that extend toward the first busbar side and are interleaved with the plurality of first electrode fingers;
  a central area at a center in a direction in which the first and second electrode fingers of the interdigital transducer electrode extend;
  a low acoustic velocity area at an outer side portion of the central area in a direction in which the electrode fingers extend where an acoustic velocity is relatively low in comparison with the central area; and
  a high acoustic velocity area at an outer side portion in a direction in which the low acoustic velocity area extends where an elastic wave propagation velocity is higher than an elastic wave propagation velocity in the central area;
when a direction perpendicular or substantially perpendicular to an elastic wave propagation direction is taken as a width direction, a dimension of the low acoustic velocity area in the width direction of at least one of the at least two of the plurality of elastic wave resonators differs from a dimension of the low acoustic velocity area in the width direction of another one of the at least two of the plurality of elastic wave resonators;
the parallel arm includes at least two parallel arm resonators included in the plurality of elastic wave resonators; and
the at least two parallel arm resonators include the one of the at least two of the plurality of elastic wave resonators and the another one of the at least two of the plurality of elastic wave resonators.

16. The elastic wave filter device according to claim 15, wherein
the serial arm includes at least one serial arm resonator included in the plurality of elastic wave resonators;

a dimension of the low acoustic velocity area in the width direction of the at least one serial arm resonator is smaller than a dimension of the low acoustic velocity area in the width direction of the one of the at least two of the plurality of elastic wave resonators included in the at least two parallel arm resonators.

17. An elastic wave filter device comprising:
a serial arm connecting an input terminal to an output terminal;
a parallel arm connecting the serial arm to a ground potential;
a plurality of elastic wave resonators; and
a capacitor; wherein
at least two of the plurality of elastic wave resonators includes a piezoelectric substrate and an interdigital transducer electrode located on the piezoelectric substrate;
the interdigital transducer electrode includes:
  a first busbar;
  a second busbar spaced from the first busbar;
  a plurality of first electrode fingers, each base end of which is electrically connected to the first busbar, that extend toward the second busbar side;
  a plurality of second electrode fingers, each base end of which is electrically connected to the second bus bar, that extend toward the first busbar side and are interleaved with the plurality of first electrode fingers;
  a central area at a center in a direction in which the first and second electrode fingers of the interdigital transducer electrode extend;
  a low acoustic velocity area at an outer side portion of the central area in a direction in which the electrode fingers extend where an acoustic velocity is relatively low in comparison with the central area; and
  a high acoustic velocity area at an outer side portion in a direction in which the low acoustic velocity area extends where an elastic wave propagation velocity is higher than an elastic wave propagation velocity in the central area;
when a direction perpendicular or substantially perpendicular to an elastic wave propagation direction is taken as a width direction, a dimension of the low acoustic velocity area in the width direction of at least one of the at least two of the plurality of elastic wave resonators differs from a dimension of the low acoustic velocity area in the width direction of another one of the at least two of the plurality of elastic wave resonators;
the serial arm includes a plurality of serial arm resonators that are included in the plurality of elastic wave resonators; and
the capacitor is connected in parallel to the plurality of serial arm resonators.

* * * * *